United States Patent [19]

Zierhut et al.

[11] Patent Number: 4,473,893
[45] Date of Patent: Sep. 25, 1984

[54] NONDESTRUCTIVE READOUT, RANDOM ACCESS CROSS-TIE WALL MEMORY SYSTEM

[75] Inventors: Lawrence G. Zierhut, Eagan; David S. Lo, Burnsville, both of Minn.

[73] Assignee: Sperry Corporation, New York, N.Y.

[21] Appl. No.: 383,434

[22] Filed: Jun. 1, 1982

[51] Int. Cl.$^3$ .............................................. G11C 19/08
[52] U.S. Cl. ...................................................... 365/87
[58] Field of Search .................................. 365/87, 171

[56] References Cited

FOREIGN PATENT DOCUMENTS 879374 8/1971 Canada .................................. 365/87

OTHER PUBLICATIONS

Design Electronics–vol. 8, No. 4, Jan. 1971, pp. 26–29.

*Primary Examiner*—James W. Moffitt
*Attorney, Agent, or Firm*—Kenneth T. Grace; Marshall M. Truex; Thomas J. Scott

[57] ABSTRACT

A nondestructive readout, random access memory system is disclosed. The memory is formed of a plurality of discrete thin ferromagnetic film memory elements in which binary data are stored as the presence, or absence, of cross-tie, Bloch-line pairs. Column lines and row lines form a matrix array of the memory elements, one at each column line, row line intersection. Cross-tie, Bloch-line pairs are formed in the memory elements by the selective coincidence of row line and column line write drive fields while readout of the presence, or absence, of the cross-tie, Bloch-line pair is by a coincident row line read drive field and a column read current signal that flows through the memory elements aligned along a selected column. A read amplifier is differentially coupled across the one fully selected memory element to detect a first, or second, opposite polarity output signal that is indicative of the presence, or absence, of a cross-tie, Bloch-line pair at the one fully selected memory element.

5 Claims, 9 Drawing Figures

WRITE

READ

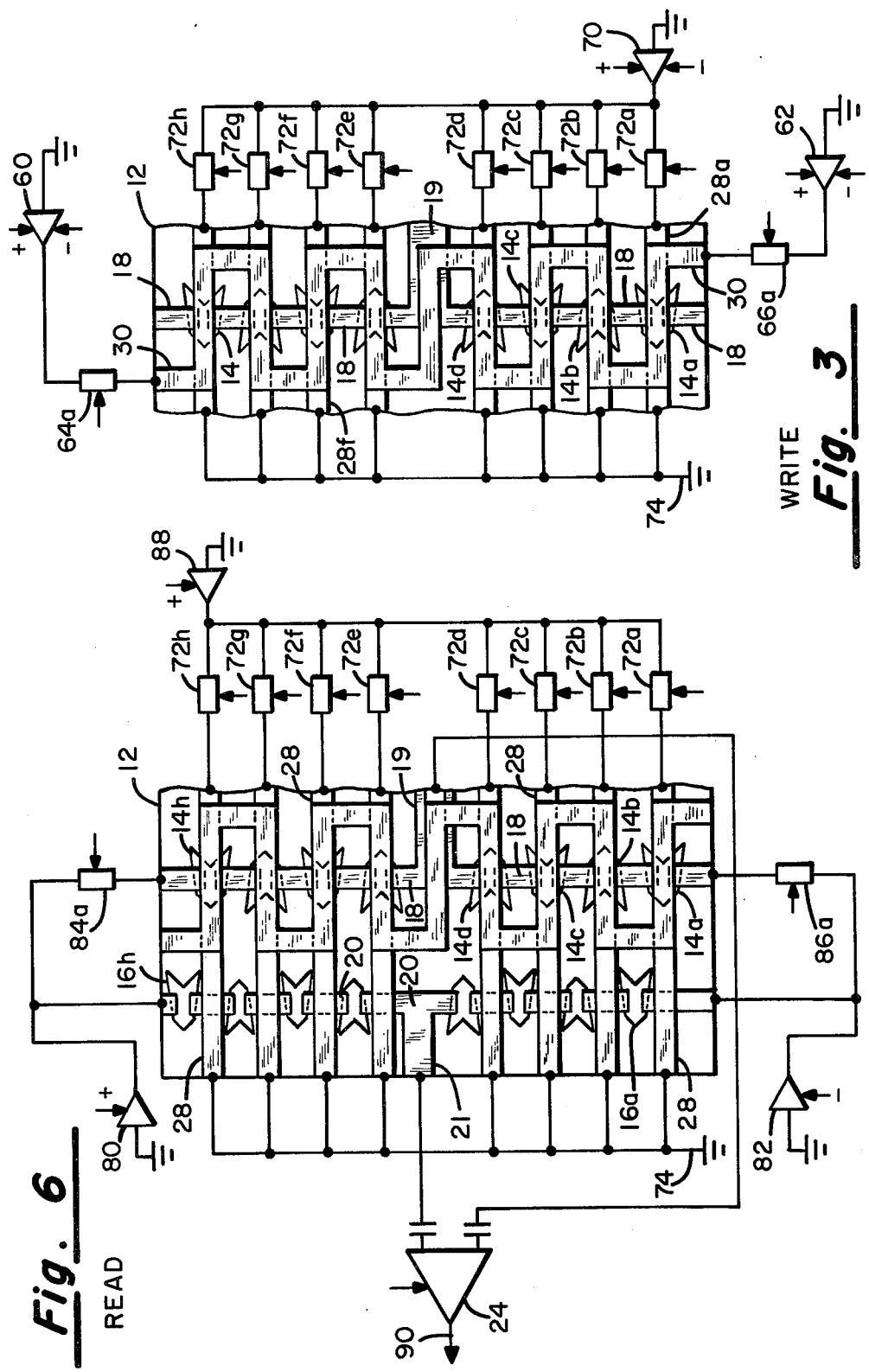

NONDESTRUCTIVE READOUT, RANDOM ACCESS CROSS-TIE WALL MEMORY SYSTEM

The invention described herein was made in the course of, or under, a contract with the Department of the Navy.

BACKGROUND OF THE INVENTION

1. Field of the Invention

The present invention relates to the field of magnetic memory systems for the storage of binary digital data and in particular to magnetic memory systems that store binary digital data as the presence or absence of cross-tie, Bloch-line pairs in the cross-tie wall of a thin ferromagnetic film.

2. Description of the Prior Art

The propagation of the inverted Néel wall sections in a serial access memory system was proposed by L. J. Schwee in the publication "Proposal On Cross-tie Wall and Bloch-line Propagation in Thin Magnetic Films" IEEE Transactions on Magnetics, MAG 8, No. 3, pages 405–407, September 1972. Such a memory system utilizes a ferromagnetic film of approximately 81% Ni-19% Fe approximately 350 Angstroms (Å) thick in which cross-tie walls can be changed to Néel walls and Néel walls can be changed to cross-tie walls by applying appropriate fields. Associated with the cross-tie wall is a section of inverted Néel wall that is bounded by a cross-tie on one end and a Bloch-line on the other end.

In such a cross-tie wall memory system, information is entered at one end of the serial access memory system by the generation of an inverted Néel wall section, which is formed by a cross-tie on one side and a Bloch-line on the other, that is representative of a stored binary 1 or of a non-inverted Néel wall section (i.e., the absence of a cross-tie and Bloch-line pair) that is representative of a stored binary 0. Such information is moved or propagated along the cross-tie wall by the successive generation (and then the selective annihilation) of inverted Néel wall sections at successive memory cells along the cross-tie wall.

In the D. S. Lo, et al, U.S. Pat. No. 3,906,466 there is disclosed a propagation circuit for the transfer of inverted Néel wall sections at successive memory cells along the cross-tie wall. In the L. J. Schwee U.S. Pat. No. 3,868,660 and in the publication "Cross-tie Memory Simplified by the Use of Serrated Strips," L. J. Schwee, et al, AIP Conference Proceedings, No. 29, 21st Annual Conference on Magnetism and Magnetic Materials, 1975, published April 1976, pages 624–625, and in the publication "Cross-Tie/Bloch-Line Detection," G. J. Cosimini, et al, AIP Conference Proceedings, No. 3, 23rd Annual Conference on Magnetism and Magnetic Materials, 1977, published March 1978, pages 1828–1830, there have been published more recent results of the further development of cross-tie wall memory systems.

In prior art cross-tie wall memory systems, the magnetic film that functions as the storage medium has the property of uniaxial anisotrophy provided by its magnetic field induced easy axis, which easy axis is generated in the magnetic film during its formation in the vapor deposition process. This easy axis provides an anisotropy that constrains the generation of the cross-tie wall along and parallel to the easy axis. In the above L. J. Schwee, et al, AIP publication there are proposed serrated strips of Permalloy film, about 350 Angstroms (Å) in thickness and 10 microns ($\mu$m) in width, which serrated strips are etched from a planar layer of the magnetic material so that the strips are aligned along the easy axis of the film. After an external magnetic field is applied normal to the strip length, i.e., transverse the easy axis of the film, the magnetization along the opposing serrated edges rotates back to the nearest direction that is parallel to the edge. This generates two large domains that are separated by a Néel or cross-tie wall that is formed along the centerline of the strip. Cross-ties are energetically more stable at the necks of the serrated edges while Bloch-lines are energetically more stable in the potential wells between adjacent necks.

In the M. C. Paul, et al, U.S. Pat. No. 4,130,888 there is disclosed a cross-tie wall memory system and in particular a data track therefore that is formed of a strip of magnetic material having substantially zero magnetic field induced anisotropy. The data-track-defining-strip of isotropic material utilizes its shape, i.e., its edge contour induced, anisotropy to constrain the cross-tie wall within the planar contour and along the centerline of the film strip. Accordingly, the cross-tie wall is constrained to follow the path defined by the magnetic film, strip which path may be configured into a major loop, or circular data track, configuration for large capacity memory storage.

In the M. C. Paul, et al, U.S. Pat. No. 4,153,160 there is provided a nondestructive readout, random access cross-tie wall memory system in which there is provided a shift register having a cross-tie, Bloch-line pair generator at one end and a detector in the middle. The shift register consists of at least 2N memory cells spaced therealong, each memory cell consisting of a store selection and a transfer section. The N cross-tie, Bloch-line pairs, or bits of the to-be-stored N-bit data word, are written or stored into the N memory cells of the shift register between the generator and the detector. For the readout of the stored data word, the N-bits are shifted through the detector into N memory cells (0 through N−1) with the N−1$^{th}$ bit being left resident in the detector. After readout, the N bits of the readout data word are restored into their original stored memory cells by being reverse shifted through the detector.

However, it has been found that because of the operating characteristics, including the inclusion of defects in the data track or shift register defining strips of thin ferromagnetic material, of the prior art cross-tie wall memory systems, it has been difficult to develop a workable memory system having a capacity of a large number of data bits, e.g., 1K. The primary problem has been with the method of propagation of the data bits, it requiring the successive generation and annihilation of the data bit defining cross-tie, Bloch-line pairs. System tolerances have been found to vary to the degree that random destruction of data bits has made large scale memories unreliable. In the present invention, this primary source of the loss of data bits has been obviated by a static memory system in which the data bits are selectively written into discrete memory elements, one at each intersection of an XY array of discrete memory elements. Each discrete memory element of the array is arranged in a typical two-dimensional, one-bit word memory array.

SUMMARY OF THE INVENTION

In the present invention, the thin ferromagnetic film storage material is formed in a plurality, XY, of discrete memory elements which are arranged in an X row, Y column matrix array. The X memory elements of each of the Y memory columns are intercoupled by low resistance current coupling elements whereby a current signal may be coupled to and caused to flow through the successive memory-column-forming coupling elements—memory elements—coupling elements. Superposed intersecting X row current conducting drive lines are inductively coupled to the discrete memory elements at each XY intersection. Readout of the storage, vel non, of a cross-tie, Bloch-line pair defining 1 data bit, or 0 data bit, at the selected memory element is accomplished by coupling a current signal to a selected one of the Y memory columns and a selected one of the X row lines and detecting a resistance change in the selected memory column. The configuration is of a 1-bit random access memory plane with nondestructive readout.

BRIEF DESCRIPTION OF THE DRAWINGS

FIG. 3 is a schematic illustration of a portion of the memory plane of FIG. 1 and the associated circuitry for the writing of information into the memory plane.

FIG. 6 is a schematic illustration of a portion of the memory plane of FIG. 1 and the associated circuitry for the reading out of the information written into the memory plane.

DESCRIPTION OF THE PREFERRED EMBODIMENT

Figure 1:
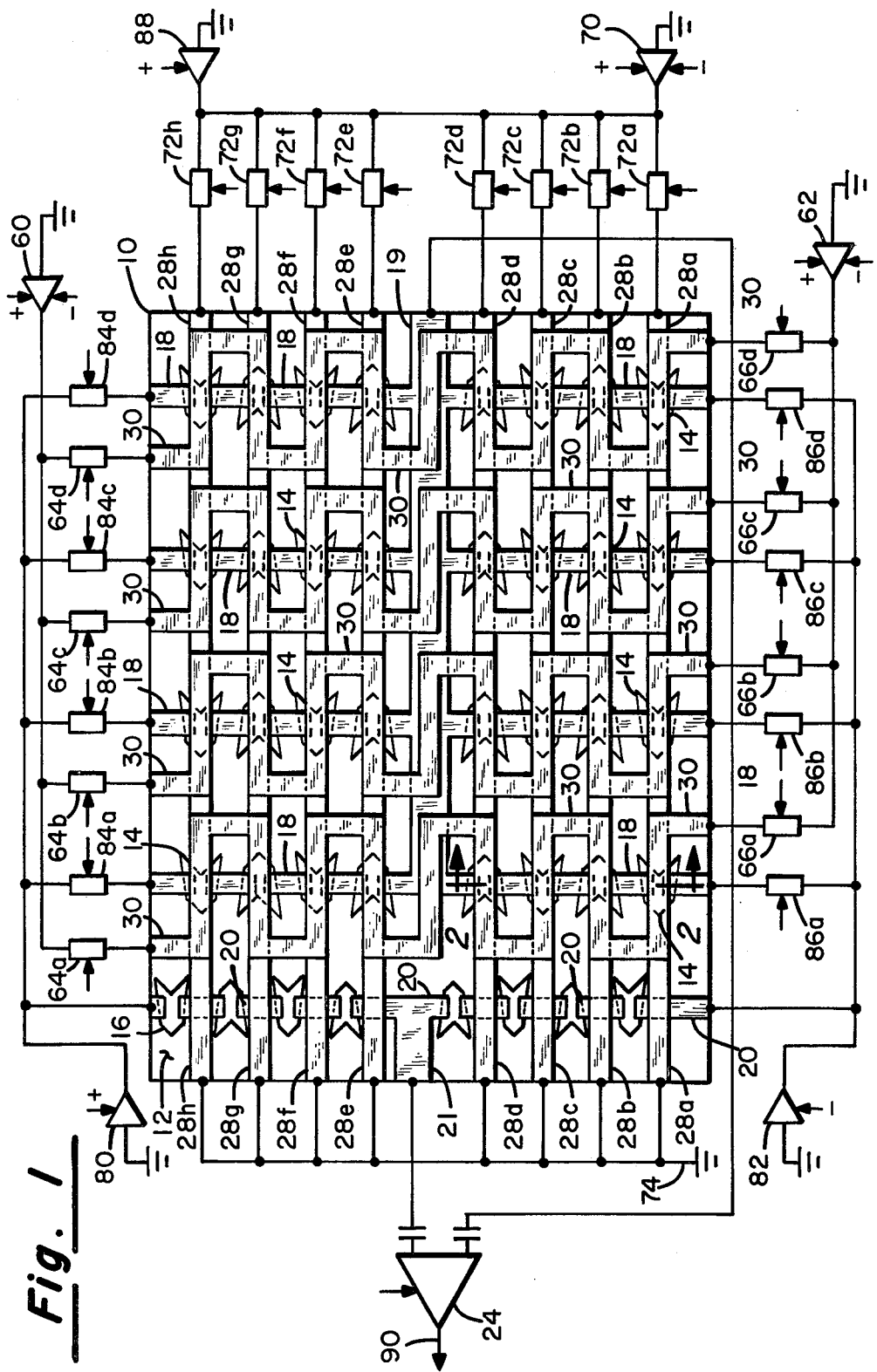
FIG. 1 is a schematic plan view of a random access memory system incorporating the present invention.
Figure 2:
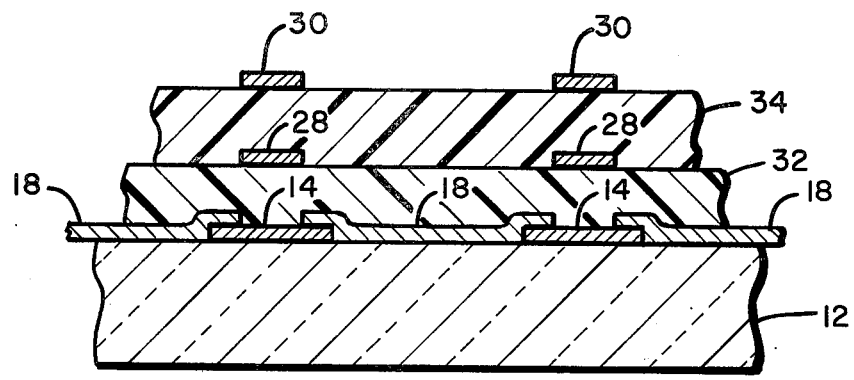
FIG. 2 is a cross-sectional view of the memory plane of FIG. 1 taken along line 2—2 thereof.

With particular reference to FIG. 1 there is presented a schematic plan view of a memory system incorporating the present invention. FIG. 2 is an illustration of a cross sectional view of the memory plane 10 of FIG. 1 taken along line 2—2 thereof for the purpose of illustrating the stacked, superposed elements of FIG. 1. Memory plane 10 of FIG. 1 includes a nonmagnetizable, e.g., glass or silicon, substrate member 12 having the following active members arranged in a stacked, superposed integral assembly.

a plurality, i.e., 32 of magnetizable, e.g., NiFe, serrated-edged discrete memory elements 14 arranged in a 4×8 matrix array and 8 magnetizable serrated-edge discrete reference elements 16, identical to memory elements 14, which are utilized in the present invention during the reading operation to function as a resistive balance bridge with 8 other column-oriented memory elements 14;

a pattern of conductive, e.g., gold, straight-edged striplines 20 and 18 for electrically intercoupling reference elements 16 and memory elements 14, respectively, for conducting a column read signal through the column-forming striplines 20 and reference elements 16 and for selectively coupling a column read signal to a selected 8 of the memory elements 14 whereby a readout signal is coupled across striplines 21 and 19—and thence to an external differential amplifier 24.

a pattern of conductive, e.g., gold, straight-edged row-forming striplines 28 whereby 4 each of the memory elements 14 are aligned along each of the respectively associated row-forming striplines 28 and one each of the reference elements 16 is offset from and spaced intermediate adjacent ones of the striplines 28; and, a pattern of conductive, e.g., gold, serpentine column-forming striplines 30, row-aligned parallel portions of which are superposed an associated memory element 14 and parallel to an associated portion of a row-forming stripline 28.

Not illustrated in either FIG. 1 or FIG. 2 are thin adhesive layers of, e.g., chromium that may be affixed to the top and/or the bottom surfaces of the metallic layers for ensuring an integral assembly of the metallic layers with the adjacent metallic or insulating layers.

FIG. 2 illustrates this stacked superposed relationship of the active elements of FIG. 1 and which illustrates the insulating layers of 32 and 34 that insulatively assemble the conductive members of memory plane 10 into an integral assembly. FIG. 2 illustrates that the stacked, superposed relationship described above includes the following listed successive layers:

glass substrate 12—0.50 mm thick.

Permalloy memory elements 14 (and reference elements 16)—approximately 81% Ni-19% Fe 350 Å thick.
chromium adhesive layer—100 Å thick.
gold striplines 18 (and striplines 19, 20 and 21)—1,000 Å thick.
chromium adhesive layer—100 Å thick.
SiO insulative layer 32—12,500 Å thick.
chromium adhesive layer—100 Å thick.
gold striplines 28—1,000 Å thick.
chromium adhesive layer—100 Å thick.
SiO insulative layer 34—12,500 Å thick.
chromium adhesive layer—100 Å thick.
gold striplines 30—1,000 Å thick.

Prior to writing any information into memory plane 10, it is necessary, as is well known, to establish cross-tie walls into memory elements 14. Assuming that the magnetization across the cross-tie walls that are to be formed in memory elements 14 is to be established in a downward direction, i.e., directed in the plane of memory elements 14 (and memory plane 10) and directed normal to the bottom edge of memory plane 10 as is used in FIG. 1, an external gross magnetic field is initially coupled to and then removed from memory plane 10 and is directed in the plane of memory plane 10 and in a downward direction. This external gross magnetic field establishes the magnetization in all of the memory elements 14 into the initial magnetic states denoted by memory elements 14b or 14c of FIG. 5. These initial magnetic states are denoted as the stored 0 state having no cross-tie, Bloch-line pairs associated therewith.

Figures 5, 8:
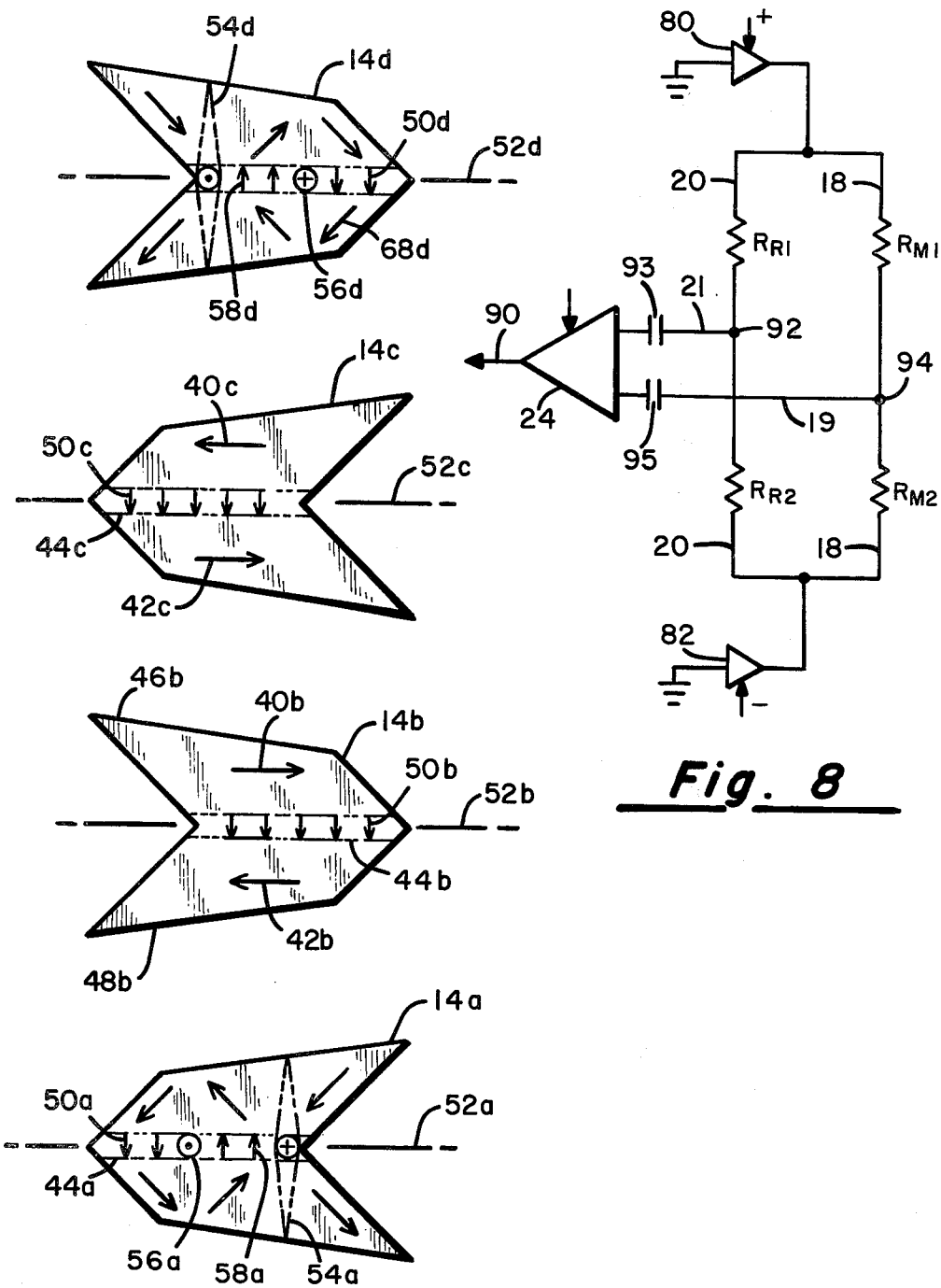
FIG. 5 is an illustration of the magnetic states of four memory elements of FIG. 1 when storing the data word 1001.
FIG. 8 is a circuit schematic representative of the resistance effects of the reference elements and memory elements of FIG. 6.

These initial magnetic states are exemplified by two large magnetic domains of opposite polarity, denoted by arrows 40b, 42b of memory element 14b of FIG. 5 separated by the cross-tie wall 44b oriented along geometric centerline 52b and having this magnetization directed downwardly, as denoted by arrows 50b. Additionally, because of the serrated edge contours of the memory elements 14, the polarities of the two large magnetic domains above and below cross-tie wall 44b are determined by the angle of the top and bottom edges 46b and 48b to their geometric centerline 52b whereby the polarities are directed oppositely in opposite direction pointed memory elements 14, e.g., in memory element 14b, pointing to the right, the top magnetic domain is directed to the right, denoted by arrow 40b, while the bottom magnetic domain is directed to the left, denoted by arrow 42b, while in memory element 14c, pointing to the left, the top magnetic domain is pointed to the left, denoted by arrow 40c, while the bottom magnetic domain is pointed to the right, denoted by arrow 42c. This oppositely pointed direction of adjacent column-oriented memory elements 14 and their oppositely directioned magnetic domains in the adjacent memory elements, e.g., 14b, 14c, is the basis for the need for the serpentine column-oriented stripline 30 whereby a current signal coupled thereto generates in the areas of the adjacent column-oriented memory elements 14 magnetic fields of opposite polarities, i.e., upwardly, downwardly directed in the plane of memory elements 14. Additionally, because of this opposite magnetic orientation of oppositely pointed memory elements 14, the stored 1 state having a cross-tie bloch-line pair established therein, is of an opposite mirror image, magnetic orientation in oppositely pointed memory elements 14, as in memory elements 14a, 14d of FIG. 5.

To establish an initial understanding of the write, read operation of the memory system of the present invention, the following broad write, read operation descriptions are provided.

Write Operation

1. Activate column write amplifier 60 by coupling a signal to either the + or − terminal.
2. Activate column write amplifier 62 by coupling a signal to either the − or + terminal − the opposite polarity terminal to that of column write amplifier 60 whereby the positive current flow is from the + terminal activated column write amplifier to the − terminal activated column write amplifier.
3. Activate or select one of the 4 column-oriented pairs of column gates 64, 66 to select one of the four columns of four column-oriented memory elements 14. This couples the current signal flowing between column write amplifiers 60 and 62 to the one selected serpentine stripline 30, generating alternate in-plane polarity column drive fields to the adjacent 8 column-oriented memory elements 14. This column drive field is like a typical magnetic memory half select drive field and has no substantial affect upon the magnetic states of the inductively coupled memory elements 14.
4. Activate row write amplifier 70 by coupling a signal to either the + or − terminal.
5. Activate or select one of the 8 row-oriented row gates 72. This couples the current signal flowing from the row write amplifier 70 to ground at grounding terminal 74 via the one selected row stripline 28 generating an in-plane alternatively downwardly directed or upwardly directed row drive field in the area of the one fully selected memory element 14 at the intersection of the selected row and column lines. This row drive field, when combined with the concurrently generated column drive field in the plane of the concurrently affected memory element 14:

If the row drive field and the column drive field are of the same upward direction, i.e., are fully selected, the memory element is written into a stored 1 state of memory elements 14a and 14d of FIG. 5;

If the row drive field and the column drive field are of the same directed, i.e., are fully selected, the memory element is written into a stored 0 state of memory elements 14b and 14c of FIG. 5.

If the row drive field and the column drive field are in different directions, the storage state of the memory element is unaffected; and, Note that memory elements not concurrently affected by a row drive field and a column drive field, i.e., are half selected, and have their stored states unaffected.

Read Operation

1. Activate column read amplifier 80 by coupling a signal to the + terminal.
2. Activate column read amplifier 82 by coupling a signal to the − terminal. Here the positive current flow is always from the column read amplifier 80 to the column read amplifier 82, as through the stripline 20, reference element 16 forming column line.
3. Activate or select a pair of column-oriented column gates 84, 86 to select one of the 4 columns of 8 column-oriented memory elements 14. This couples the current signal flowing between the column read amplifiers 80 and 82 to the one selected stripline 18 memory element 14 forming column line whereby the current signal flows through the memory elements 14. This single current signal has no substantial effect upon the magnetic states of the so-effected memory elements 14.
4. Activate row read amplifier 88 by coupling a signal to the + terminal.
5. Activate or select one of the 8 row-oriented row gates 72. This couples the current signal flowing from the row read amplifier 88 to ground at grounding terminal 74 via the one selected row stripline 28 generating an in-plane downwardly directed row drive field in the area of one fully selected memory element 14 at the intersection of the selected row and column lines. This row drive field, when acting upon the memory element 14 through which the current signal from the activated column read amplifiers 80 and 82 is flowing, induces a change in the resistance to the current flow therethrough. This resistance change is different for a stored 1 than for a stored 0. The present invention includes the discovery that the resistance change in the one fully selected memory element 14 produces a bi-polar readout signal that, via a resistance bridge and differential amplifier 24 circuit arrangement—see FIG. 8—provides a readout technique that is a substantial improvement over prior readout techniques that rely upon the difference in amplitude between the readout of a stored 1 and a stored 0. This readout technique will be discussed in greater detail below.

Note that current signal polarities are changed for the write read operations whereby the fields in the plane of memory elements 14 are directed:

downwardly to establish the magnetization in the memory elements 14 in the magnetic states of memory elements 14b, 14c for the stored 0 state;

upwardly to establish magnetization of the memory elements 14 in the magnetic states of memory elements 14a, 14d for the stored 1 state; and, downwardly to, in combination with the column read current signal, readout both of the stored 1 and 0 states from memory elements 14a, 14b, 14c or 14d.

Figure 4:
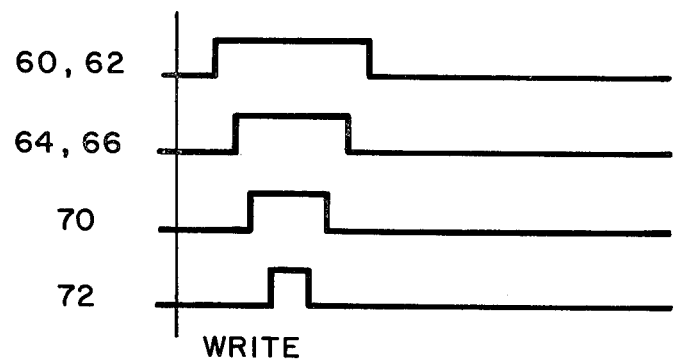
FIG. 4 is an illustration of a timing diagram for the writing of a data bit in a memory element of FIG. 1.

With particular reference to FIGS. 3 and 4, there are presented a schematic illustration of a portion of memory plane 10 of FIG. 1 and the associated circuitry for the writing of information therein using the write signal timing diagram of FIG. 4. Note that the timing diagrams of FIGS. 4 and 7, except for the readout signal at output line 90, do not denote signal polarities, only timing relationships between the signals. For the purpose of the present discussion, assume that the memory elements 14a, 14b, 14c, 14d are initially in a stored 0 state; however, this is not essential to the operation of the memory system of the present invention for the rewriting of a memory element 14 into a stored 0 state from a stored 1 state is the same as if the memory element were initially in a stored 0 state and a stored 0 state was to be restored therein. This stored 1001 state of the memory elements 14a, 14b, 14c, 14d is illustrated in FIG. 5 wherein only the memory elements 14 are illustrated for clarifying the magnetic states thereof.

To write memory element 14a into a stored 1 state, the concurrent magnetic fields from stripline 28 and stripline 30 must be directed upwardly for if memory element 14a is initially in a stored 0 state, as illustrated in memory element 14c of FIG. 5, a portion of the downwardly directed arrows 50a of cross-tie wall 44a must be reversed by forming the cross-tie 54a, Bloch-line 56a pair therein with the upwardly directed arrows 58a of the inverted Néel wall portion formed therebetween. This is accomplished by coupling a column write signal to the + terminal of column write amplifier 60, a column write signal to the − terminal of column write amplifier 62 and a row write signal to the − terminal of row write amplifier 70, while concurrently coupling a column gate signal to column gates 64a, 66a and a row gate signal to row gate 72a, all pursuant to the timing diagram of FIG. 4. The column write field and the row write field add in an upwardly direction in the plane of memory element 14a to establish the magnetization of memory element 14a into the magnetic state of FIG. 5.

To write memory element 14b into a stored 0 state, the concurrent magnetic fields from stripline 28 and stripline 30 must be directed downwardly. With memory element 14b initially in a stored 0 state no magnetic fields need need be coupled to memory element 14b. However, the write 0 procedure is accomplished by coupling a column write signal to the + terminal of column write amplifier 60, a write signal to the − terminal of column write amplifier 62 and a row write signal to the + terminal of row write amplifier 70, while concurrently coupling a column gate signal to column gates 64a, 66a and a row gate signal to row gate 72b, all pursuant to the timing diagram of FIG. 4. The column write field and the row write field add in a downwardly direction in the plane of memory element 14b to establish the magnetization of memory element 14b into the magnetic state of FIG. 5.

To write memory element 14c into a stored 0 state, the concurrent magnetic fields from stripline 28 and stripline 30 must be directed downwardly. With memory element 14c initially in a stored 0 state, no magnetic fields need be coupled to memory element 14c. However, the write 0 procedure is accomplished by coupling a column write signal to the − terminal of column write amplifier 60, a column write signal to the + terminal of column write amplifier 62 and a row write signal to the + terminal of write row amplifier 70, while concurrently coupling a column gate signal to column gates 64a, 66a and a row gate signal to row gate 72c, all pursuant to the timing diagram of FIG. 4. The column write field and the row write field add in a downwardly direction in the plane of memory element 14c to establish the magnetization of memory 14c into the magnetic state of FIG. 5.

To write memory element 14d into a stored 1 state, the concurrent magnetic fields from stripline 28 and stripline 30 must be directed upwardly for if memory element 14d is initially in a stored 0 state, as illustrated in memory element 14b, a portion of the downwardly directed arrows 50d of cross-tie wall 44d must be reversed by forming a cross-tie 54d, Bloch-line 56d pair therein with the upwardly directed arrows 58d of the inverted Néel wall portion formed therebetween. This is accomplished by coupling a column write signal to the − terminal of column write amplifier 60, a column write signal to the + terminal of column write amplifier 62 and a row write signal to the − terminal of row write amplifier 70, while concurrently coupling a column gate signal to column gates 64a, 66a and a row gate signal to row gate 72d, all pursuant to the timing diagram of FIG. 4. The write column field and the write row field add in a upwardly direction in the plane of memory element 14d to establish the magnetization of memory element 14d into the magnetic state of FIG. 5.

Figure 7:
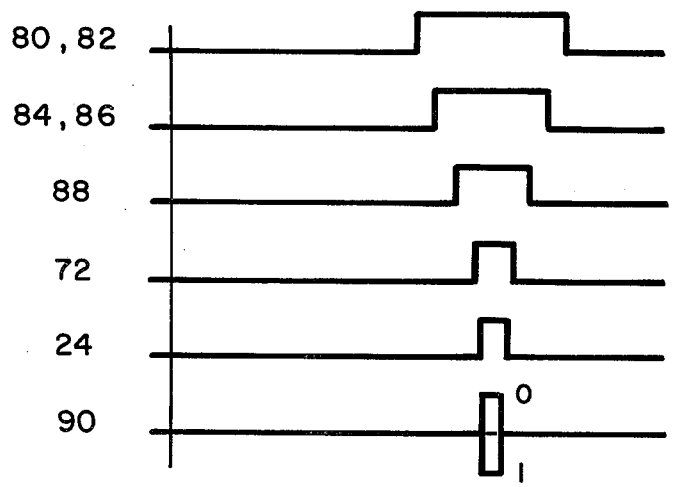
FIG. 7 is an illustration of a timing diagram for the reading out of a data bit written into a memory element of FIG. 1.

With particular reference to FIGS. 6 and 7 there are presented a schematic illustration of a portion of memory plane 10 of FIG. 1 and the associated circuitry for the reading of information therein using the read signal timing diagram of FIG. 7. To read out memory element 14a, the magnetic field from the selected stripline 28a is directed downwardly while concurrently a column read signal is caused to flow through the readout memory element 14a of the selected memory column via the memory column-forming stripline 18—memory element 14—stripline 18 via the selected column gates 64a, 66a. This read operation is accomplished by coupling a column read signal to the + terminal of column read amplifier 80 and a column read signal to the − terminal of column read amplifier 82, while concurrently coupling a column gate signal to column gates 64a, 66a, all pursuant to the timing diagram of FIG. 7. A column read current signal is caused to flow through the reference-column-forming striplines 20, of reference element 16 and a column read current signal is caused to flow through the column-forming striplines 18, memory elements 14 (as selected by the column gates 64a, 66a) including memory element 14a. A row read signal is then coupled to the + terminal of row read amplifier 88, a row read signal is then coupled to row gate 72a and a read gate signal is then coupled to read amplifier 24 coupling a negative read stored 1 state signal to output line 90, all pursuant to the timing diagram of FIG. 7.

For the readout of each of memory elements 14b, 14c, 14d, the reference-column-forming striplines 20, reference elements 60 and the memory column-forming striplines 18, memory elements 14 are selected as before (by the selected column gates 64a, 66a) with the same read current signals flowing therethrough—no current signal reversal is required for the read operation. A row read signal is coupled to the − terminal of read row amplifier 88, a row read signal is coupled to the associated row gate 72b, 72c or 72d. A read amplifier gate signal is then coupled to read amplifier 24 coupling the positive read stored 0 state, the positive read stored 0 state with the negative read stored 1 state, respectively, to output line 90, all pursuant to the timing diagram of FIG. 7.

With particular referencer to FIG. 8 there is presented a circuit schematic representative of the resistance effects of the reference elements 16 and memory elements 14 of FIG. 6. Resistors $R_{R1}$ and $R_{R2}$ are representastive of the resistance of the column-forming striplines 20, reference elements 16 above and below stripline 21 respectively, and resistors $R_{M1}$ and $R_{M2}$ are representative of the resistance of the column-forming striplines 18, memory elements 14 above and below stripline 21, respectively. Amplifier 24 is differentially coupled to the resistance bridge formed by resistors $R_{R1}$, $R_{R2}$ and $R_{M1}$, $R_{M2}$ at their midpoints 92 and 94 via striplines 21 and 19 and condensers 93 and 95, respectively.

In the above discussed example of the readout of, e.g., memory element 14a, resistor $R_{M1}$ is the representative resistance that is effected by the change in the resistance of memory element 14a to the flow of the column read current signal that is coupled thereto by column read amplifiers 80, 82 and column gates 84a, 86a. This change in resistance of the balance bridge consisting of resistors $R_{R1}$, $R_{R2}$, $R_{M1}$, $R_{M2}$ produces the negative or positive readout signal to differential read amplifier 24 which is then gated out on output line 90 and which is representative of the readout of a stored 1 state or of a stored 0 state, respectively, all pursuant to the timing diagram of FIG. 7.

Figure 9:
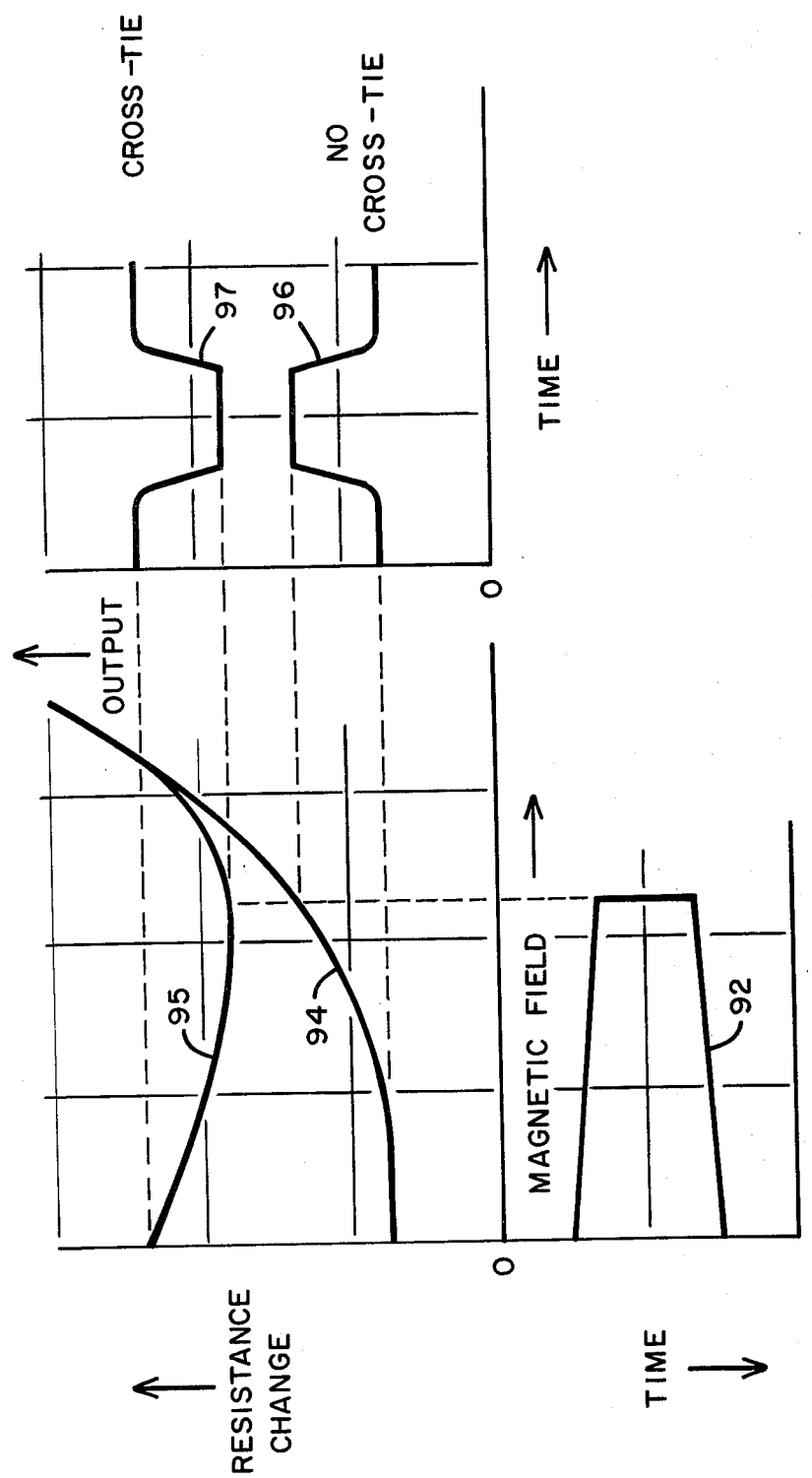
FIG. 9 is an illustration of the resistance change in a readout memory element and the resulting output signal when subjected to a transverse read drive field of FIG. 7.

FIG. 9 illustrates plots of the change 94 and change 95 in resistance upon the readout of a stored 0 state and a stored 1 state, respectively, of a memory element 14 upon the coupling thereto of a column read drive field 92, generated by a row read signal coupled to stripline 28, by row read amplifier 88 and row read gate 72. As illustrated in FIG. 9, the constantly increasing resistance plot 94 and the decreasing then slightly increasing resistance plot 95 enable opposite polarity output signals 96 and 97, respectively, to be coupled by read amplifier 24 to output line 90. These opposite polarity output signals for the readout of a stored 0 state and a stored 1 state permit the accurate determination of binary information stored in the cross-tie wall memory system of FIG. 1.

What is claimed is:

1. A cross-tie wall memory system, comprising:
    XY discrete memory elements arranged in an X row, Y column matrix array, each memory element formed of a magnetizable material having a cross-tie wall formed therein;
    a plurality of discrete low resistance coupling elements serially electrically intercoupling X discrete memory elements for forming Y memory columns of X discrete memory elements per memory column;
    X low resistance row lines, each row line inductively coupled to only one of the X discrete memory elements of each of the Y memory columns;
    column read amplifier means for coupling a column read current signal to a selected one of said Y memory columns, said column read current signal serially flowing through said discrete, low resistance, electrically intercoupling elements and said electrically intercoupled X discrete memory elements therebetween;
    row read amplifier means coupling a row read current signal to a selected one of said row lines for inductively coupling a row read drive field to each of said inductively coupled Y discrete memory element; and,
    readout means coupled to the one selected memory element, at the intersection of the one selected row line and the one selected memory column, for determining the presence or absence of a cross-tie, Bloch-line pair stored in said one selected memory element by the detection of a first or a second and opposite polarity readout signal in response to a change in the resistance of said one selected memory element to said column read current signal and said row read drive field.

2. The cross-tie wall memory system of claim 1 further including;
    X discrete reference elements each similar to each of said XY discrete memory elements;
    a plurality of discrete low resistance coupling elements for serially electrically intercoupling said X discrete reference elements for forming a reference column of X discrete reference elements;
    said X discrete reference elements offset from and spaced intermediate adjacent ones of said row lines;
    means coupled to said column read amplifier means for concurrently coupling said column read current signal to said reference-column and said one selected memory column; and,
    means coupling said readout means to said reference column for differentially coupling said readout means to said reference column and said one selected memory column.

3. The cross-tie wall memory system of claim 2 wherein said readout means further includes means for differentially coupling said readout means across the midpoints of said reference column and said Y memory columns.

4. A cross-tie wall memory system, comprising:
    XY discrete memory elements which are arranged in an X row, Y column matrix array, each memory element formed of a magnetizable material and having a geometric centerline along which a cross-tie wall is formed when subjected to appropriate magnetic fields;
    a plurality of discrete low resistance coupling elements for serially electrically intercoupling X discrete memory elements for forming Y memory columns, each having X discrete memory elements per memory column;
    X low resistance row lines, each row line superposed and inductively coupled to a corresponding one of the X discrete memory elements of each of the Y memory columns;
    column read amplifier means coupling a column read current signal to a selected one of said Y memory columns, said column read current signal serially flowing through the successive memory-column-forming coupling elements and memory elements of said selected one of said Y memory columns;
    row read amplifier means coupling a row read current signal to a selected one of said row lines for inductively coupling a row read drive field to each of the Y discrete memory elements aligned therealong; and,
    readout means coupled to the one selected memory element, at the intersection of the one selected row line and the one selected memory column, for determining the presence or absence of a cross-tie, Bloch-line pair stored in said one selected memory element by the detection of a first or a second and opposite polarity readout signal in response to a change in the resistance of said one selected memory element to said column read current signal and said row read drive field.

5. The cross-tie wall memory system of claim 4 further including:
   X discrete reference elements, each similar to each of said XY discrete memory elements;
   a plurality of discrete low resistance coupling elements for serially electrically intercoupling said X discrete reference elements for forming a reference column of X discrete reference elements;
   said X discrete reference elements offset from and spaced intermediate adjacent ones of said row lines;
   means coupled to said column read amplifier means for coupling said column read current signal to said reference-column-forming serially electrically intercoupled X discrete reference elements and said discrete low resistance coupling elements; and,
   means coupling said readout means to said reference column for differentially coupling said readout means to said reference column and said one selected memory column.

* * * * *